United States Patent [19]

Savage et al.

[11] Patent Number: 5,117,065

[45] Date of Patent: May 26, 1992

[54] METHOD OF JOINING SHIELDING USED FOR MINIMIZING EMI OR RFI, AND THE JOINT FORMED BY THE METHOD

[76] Inventors: Howard S. Savage, 808 W. Springfield, Apt. #1, Urbana, Ill. 61801; Paul H. Nielsen, 112 McKinley St., Mahomet, Ill. 61853

[21] Appl. No.: 538,806

[22] Filed: Jun. 15, 1990

[51] Int. Cl.$^5$ .......................... H05K 9/00; H01S 4/00; B23K 31/02
[52] U.S. Cl. ........................... 174/35 MS; 174/35 R; 29/592.1; 228/179
[58] Field of Search ............... 228/175, 179, 184; 29/592.1; 174/35 GC, 35 MS, 35 R; 361/424; 219/10.55 R, 10.55 D, 10.55 M

[56] References Cited

U.S. PATENT DOCUMENTS 4,890,083 12/1989 Trenkler et al. .................. 335/301
4,893,744 1/1990 Takayasu ........................... 228/184

Primary Examiner—Leo P. Picard
Assistant Examiner—Bot Lee Ledynh

[57] ABSTRACT

A method of joining shielding materials used for minimizing passage of electromagnetic and radio frequency energy through the walls of an enclosure, comprising the steps of securing a metallic backing plate to one wall of the enclosure, positioning an end portion of a first sheet of shielding material to the backing plate, then positioning an end portion of second sheet of shielding material atop the end portion of the first sheet of shielding material, and then applying a vibrating tool to the overlapped end portions of the first and second sheets of shielding material to metallurgically bond the facing surfaces of the overlapped shielding materials. A joint structure resulting from practice of the method is also disclosed.

10 Claims, 1 Drawing Sheet

METHOD OF JOINING SHIELDING USED FOR MINIMIZING EMI OR RFI, AND THE JOINT FORMED BY THE METHOD

FIELD OF THE INVENTION

The present invention concerns a method for joining shielding used for minimizing passage of electromagnetic energy and radio frequency energy into or out of an enclosure, as well as the joint resulting from the method. More particularly, the method involves the formation of a bond between overlying regions of the shielding material which is both mechanical and metallurgical in nature, and which optimizes the integrity of continuity of electrical contact.

BACKGROUND OF THE INVENTION

It is well known that, prior to the manufacture and use of electronic equipment today, shielding materials should be installed or otherwise employed to control and/or minimize electronic noise, such as electromagnetic interference (EMI) or radio frequency interference (RFI), emanating from the electronic equipment itself, from power sources, or from wires interconnecting the equipment to the power sources, as well as from the ingress of electronic noises from outside sources.

Installation of appropriate shielding materials can be undertaken at the time of original construction. For example, U.S. Pat. No. 3,322,879 to LINDGREN discloses a soundproof prefabricated demountable panel wall unit having two spaced electrically isolated layers of sheet metal shielding, while U.S. Pat. No. 2,961,478 to BURNS discloses an enclosure of the type defining a "free-space" room in which the walls are not only thermally insulated, but also shielded against electromagnetic and radio frequency interference.

On the other hand, shielding materials may be installed as a retrofit procedure. For example, U.S. Pat. No. 3,517,627 to KRUSE, U.S. Pat. No. 4,733,013 to HEMMING, and U.S. Pat. No. 4,647,714 to GOTO disclose protective shielding material spacially mounted atop the exterior surface of an existing wall, floor or ceiling, for minimizing or eliminating noise of the type caused by electromagnetic or radio frequency interference. GOTO teaches applying protective shielding material in the form of a metal-containing laminated sheet applied atop an existing wall surface as wall paper.

In the past, the material of choice for EMI and RFI shielding materials was predominantly sheet metal. More recently, however, metallic foils and laminates of metal foil bonded to reinforcing substrates are being used with greater effectiveness (see IEEE Electrical Insulation Magazine, January/February 1988, Vol. 4, No. 1, pp 11-13).

The problems of greatest concern in the installation of any type of flexible shielding material relate to the manner in which edge regions of adjacent panels have been joined together. U.S. Pat. No. 4,733,013 to HEMMING discloses a joint and a method of its formation wherein two panels of shielding material are sandwiched between two strips of shielding material, and the entire sandwich assembly is connected, via threaded fasteners, to an electrically insulating member.

Recently, it has been found that the difficulties encountered with the use of rigid sheet material differ from those encountered with flexible materials, including both metallic foils, and foil laminates. For example, optimization of the effectiveness of the flexible shielding materials depends, to a great extent, on the continuity of electrical contact between overlapping portions of the flexible material. Continuity of electrical contact at joints affects the ability of the shielding material to eliminate undesired electromagnetic and radio frequency signals, and is diminished when adjacent portions of flexible metallic shielding material sustain relative movement. There is presently no known method for joining edge or overlying regions of flexible shielding materials such that the connection of the overlying regions exhibits optimum electrical continuity, and thus optimum EMI and RFI shielding characteristics.

OBJECTS AND SUMMARY OF THE INVENTION

It is therefore the principal object of the present invention to provide a novel joint and method for forming such a joint which will overcome all the disadvantages of the prior art.

Another object of the present invention is to provide a method of mechanically securing overlapping regions of flexible shielding material such that the connections also exhibit electrical continuity.

Still another object is to provide a method of securing overlapping regions of flexible shielding material which is easy to implement, quickly accomplished, and requires minimal cost.

These and other objects and advantages of the present invention are accomplished by the provision of an improved shielding arrangement for an enclosure where shielding material is secured to wall surfaces of the enclosure and overlapping regions of the material are mechanically secured and electrically coupled. Electrical continuity of the connection between the overlapping regions of shielding material is assured by the formation of metallurgical bonds effected via application of a vibrating tool to the shielding material. In the preferred embodiment of the invention, the bonds are essentially continuous, extending between opposite sides of the shielding material and disposed perpendicular to the sides. In one variation of the invention, the bonded region includes a grouping of individual bonds, with each grouping being disposed along side; and substantially parallel to an adjacent row. Preferably, to enhance the mechanical and electrical connections between overlapping regions of the shielding material, the rows are staggered such that discontinuities in one row are located adjacent continuously bonded regions in the next adjacent row.

BRIEF DESCRIPTION OF THE DRAWINGS

These and other objects and advantages will become more apparent when considered in conjunction with the following detailed description of this invention and the drawings, in which.

DETAILED DESCRIPTION OF THE PRESENT INVENTION

Figure 1:
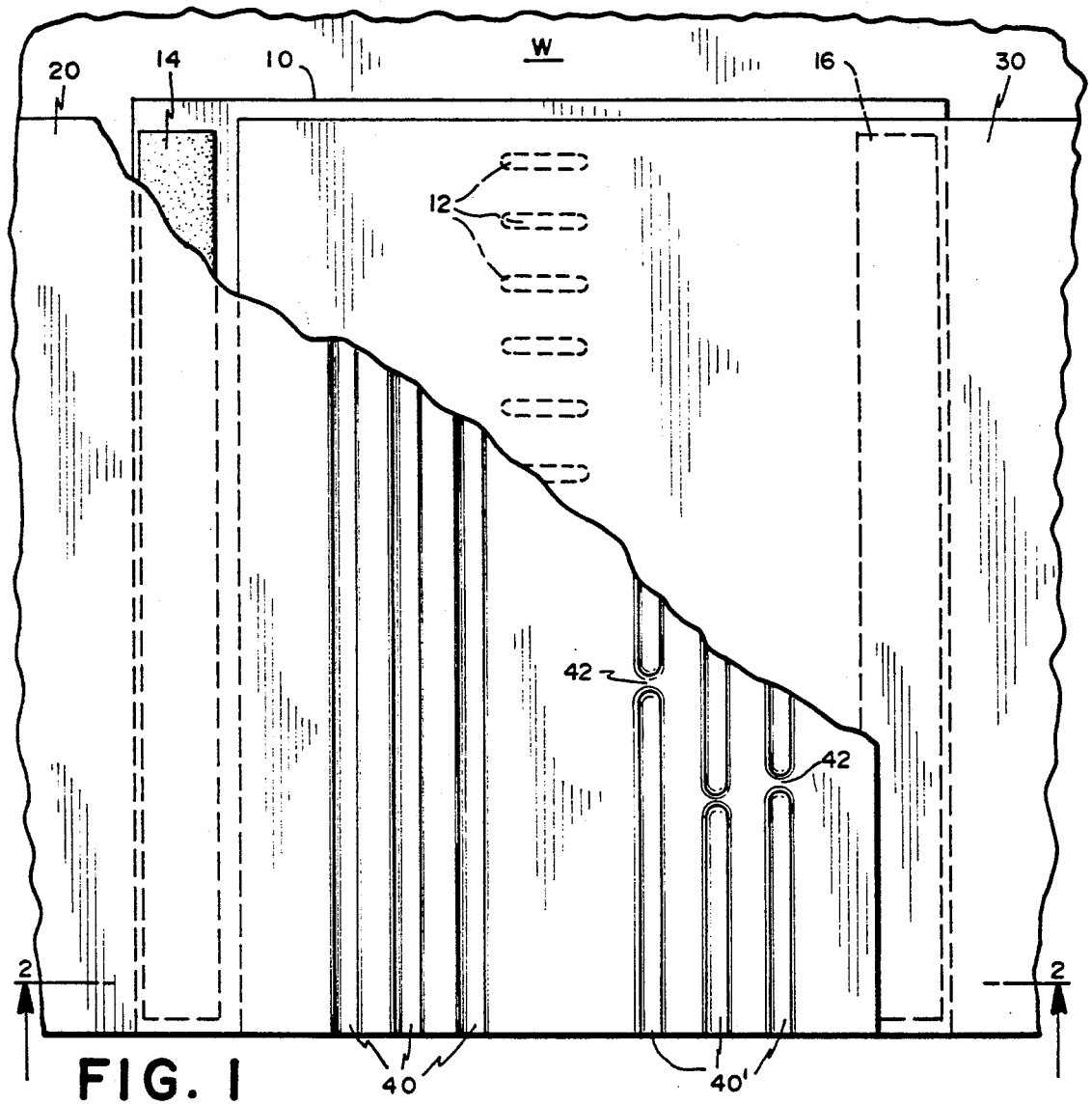
FIG. 1 illustrates the shielding construction of the present invention in plan view.
Figure 2:
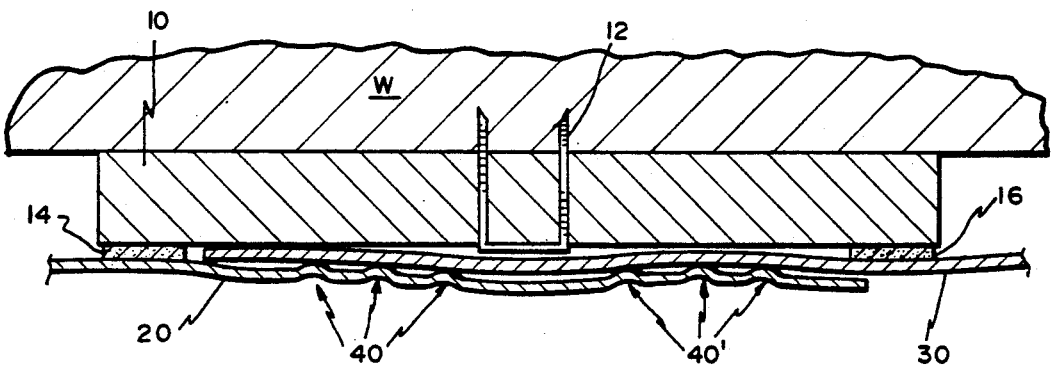
FIG. 2 illustrates a sectional view of the shielding construction of the present invention taken along section lines 2—2 in FIG. 1.

Referring now to FIGS. 1 and 2, the joint construction of the present invention is seen to include a backing plate 10 attached via fasteners 12 to a wall W, a first sheet 20 of metallic foil attached to the backing plate at a first region of attachment 14 and covering substantially all of the entire surface of the backing plate except a second region of attachment 16, a second sheet 30 of metallic foil attached to the backing plate at the second region of attachment 16 and overlying substantially the entire surface of the first sheet of metallic foil disposed atop the backing plate, and bonding seams 40, 40' formed via the bonding process contemplated by the present invention and through which facing surfaces of the first and second sheets of metallic foil are directly secured together.

The backing plate 10 comprises a metallic material and is of a construction which will provide sound mechanical support for attachment of the first and second foils. The backing plate also provides the stability necessary to effect bonding of the first and second foils when using the method of bonding contemplated by the present invention.

A material which can be used for the backing plate is aluminum since it has been found to be one of the most suitable for the applications contemplated by the present invention. However, the present invention also envisions the use of other metallic conductors as well. The thickness of the backing plate 10 preferably is chosen such that it can provide the degree of support considered necessary during bonding of the two foils, while still being thin enough to allow for ease of fabrication of the joint (i.e., shearing, handling and fastening).

The backing plate 10 is preferably secured to the wall W via metallic fasteners 12. The most preferable fasteners are staples, such as are shown in the drawings. However, where such metallic fasteners are used, they must be insulated or otherwise isolated from the sheets of metallic foil in order to avoid galvanic corrosion. One manner of achieving isolation of the fasteners might be to place tape over the fasteners. However, it is noted that this "solution" would not guarantee elimination of corrosion of the backing plate.

Preferably, the composition of the first and second sheets of metallic foil 20,30 are the same, and it is preferred that they also match the composition of the backing plate. This is important for avoiding galvanic corrosion between those surfaces of the foils and the backing plate which are in contact with one another.

The first and second regions 14,16 of attachment for metallic foils 20,30 comprise adhesive means, such as tape or glue, which is carried by or secured to the backing plate and used for securing end regions of each of the sheets of metallic foil to the backing plate 10. The first and second regions of adhesive means are preferably located on opposite sides of the backing plate, and provide a transfer of mechanical support from the foil to the backing plate without loading the bonding seams. If multiple bond seams are used, it may be appropriate to locate an additional region of adhesive means near the center of the region of overlap of the two foils 20 and 30. However, care should be taken to ensure that the adhesive means not be placed under the bonding seams inasmuch as the "softness" of the adhesive means tends to inhibit the bonding process between the foils.

As seen most clearly in FIG. 1, the first and second sheets of metallic foil are secured to one another via the bonding seams, a first embodiment of which is designated by the numeral 40, while a second embodiment is designated by the numeral 40'. Bonding seams 40 are seen to be comprised of a plurality of parallel, continuous bonds. Bonding seams 40' are seen to be comprised of a plurality of linearly arranged, elongated "bonding" regions, all extending in rows disposed parallel to one another. The bonding seams 40' are characterized by discontinuities located between the bonding regions, and being encompassed on either side by other bonding regions.

Both of the embodiments of bonding seams illustrated in FIG. 1 are formed by a process of vibromechanical wiping or pressing similar to the process which occurs during ultrasonic welding. In the process contemplated by the invention, electrical continuity is established between the two sheets of metallic foil by formation of a metallurgical, as well as mechanical, bond. This bond is obtained by using a vibrating engraver, where relative vibratory motion, under pressure, is applied against (onto) the adjacent superposed surfaces of the overlying metallic foils. The engraver acts to disrupt the surface oxide films of the adjacent foil surfaces and facilitates the formation of a metallurgical, as well as mechanical, bond. The foil thicknesses and the power of the vibrating engraver, as well as the amount of applied pressure, are important factors in determining the quality of bond formed.

Preferably, when attaching the foil end regions to one another using the bonding process of the present invention, a bond will also be formed between the foils and the backing plate. Such a bond is desirable since electrical contact between the backing plate and the foils provides an additional degree of shielding.

It is most desirable that the composition of the sheets of metallic foils be substantially similar so as to avoid localized galvanic corrosion between the sheets. While dissimilar foils could be bonded by this process, there is a significant tendency for galvanic corrosion to occur. It is also desirable that the foil compositions match the composition of the backing plate so that galvanic corrosion will be minimized. Where such matching is not possible, then the composition of the foil sheets should be more noble than the composition of the backing plate so that sacrificial corrosion of the backing plate occurs to protect the foils.

One embodiment of the joint construction, which was formed in accordance with the teachings of the present invention, included a "wall" comprising a piece of scrap lumber to which a 14 mil thick aluminum backing plate was attached via staples. Two sheets of 1.5 mil thick aluminum foil were attached to the backing plate with double-stick adhesive tape, and bonding seams were formed using a vibrating engraver with a carbide tip.

The foregoing is a description of the preferred embodiments of the present invention. It is to be understood, however, that the embodiments so described are for purposes of example only and are not intended to limit the invention in any manner. It is further understood that modifications in the article and method of the present invention evidencing a reasonable range of equivalents are contemplated.

What is claimed is:

1. A method for forming an electrical and mechanical connection between two end regions of metallic foils used as shielding material to minimize passage of electromagnetic or radio frequency energy through the walls of an enclosure, said method comprising the steps of:

a. attaching a metal backing plate to a surface of one of the walls;

b. providing adhesive means on said backing plate;

c. positioning one end region of a first metallic foil across said backing plate from a first direction,
d. securing said end region of said first foil to said adhesive means;
e. positioning one end region of a second metallic foil across said backing plate and a portion of said first foil end region;
f. securing said second foil end region to said adhesive means such that said first and second foil end regions overlap one another to form an overlapping region, and
g. forming a metallurgical bond between surfaces of said first and second foils which are disposed one atop the other at said overlapping region to form a bonding zone extending in a second direction perpendicular to said first direction, said metallurgical bond formed by pressing a vibrating tool against said overlapping region and simultaneously moving said tool linearly in said second direction such that said first and second foils are bonded along at least one continuous region in said bonding zone.

2. The method of claim 1, wherein said step of forming a metallurgical bond between said surfaces of said first and second foils comprises the step of electrically and mechanically bonding said surfaces together in said bonding zone.

3. The method of claim 1, wherein said step of forming said metallurgical bond further comprises the step of repeating said pressing and moving steps at said overlapping region such that a plurality of continuous regions are formed in said bonding zone.

4. The method of claim 3, wherein said step of repeating is performed continuously in said second direction at adjacent spaced locations such that a plurality of substantially parallel, continuous, linearly extending bonds are formed in said bonding zone.

5. The method of claim 4, wherein said step of repeating is performed at intervals in said second direction so that said bonding zone comprises a plurality of rows of linearly spaced bonds is formed, said rows being spaced from one another in said first direction and staggered in said second direction.

6. A joint structure for end regions of metallic foil sheets of shielding material adapted for minimizing passage of electromagnetic or radio frequency energy through the walls of an enclosure, said joint structure comprising:
a. a metallic backing plate attached to one of the walls of the enclosure,
b. adhesive means on said backing plate,
c. a first metallic foil sheet having a first metallic foil sheet end region being disposed over and secured to the adhesive means on said backing plate,
d. a second metallic foil sheet having a second metallic foil sheet end region being disposed over said first metallic foil sheet end region such that said end regions of said first and second metallic foil sheet overlap one another forming an overlapping region, said second metallic foil sheet end region being attached to the adhesive means on said backing plate, and
e. at least one bonding zone defined at said overlapping region, each said bonding zone comprising at least one substantially linearly extending metallurgical bond formed between facing surfaces of said first and second metallic foil sheets such that said overlapping region of said first and second metallic foils are mechanically and electrically coupled with one another, each said bonding zone comprises a set of linearly extending bond rows, said bond rows being disposed parallel to one another.

7. The joint structure of claim 6, wherein said adhesive means on said backing plate comprises a pair of laterally spaced adhesive regions located in such a manner that when said first metallic foil sheet end region is secured to one of said adhesive regions on said backing plate, only the other of said adhesive regions is exposed for securing said second metallic foil sheet end region.

8. The joint structure of claim 6, wherein said first and second metallic foil sheets have the same composition.

9. The joint structure of claim 8, wherein said first and second metallic foil sheets comprise laminated sheets.

10. The joint structure of claim 6, wherein said set bond rows include discontinuities between individual bonds, the discontinuities in any one row of said set being staggered relative to the discontinuities in any other row of said set.

* * * * *